United States Patent
Canaperi et al.

(10) Patent No.: US 7,045,453 B2
(45) Date of Patent: May 16, 2006

(54) VERY LOW EFFECTIVE DIELECTRIC CONSTANT INTERCONNECT STRUCTURES AND METHODS FOR FABRICATING THE SAME

(75) Inventors: Donald F. Canaperi, Bridgewater, CT (US); Timothy J. Dalton, Ridgefield, CT (US); Stephen M. Gates, Ossining, NY (US); Mahadevaiyer Krishnan, Hopewell Junction, NY (US); Satya V. Nitta, Poughquag, NY (US); Sampath Purushothaman, Yorktown Heights, NY (US); Sean P. E. Smith, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/104,764

(22) Filed: Apr. 12, 2005

(65) Prior Publication Data

US 2005/0186778 A1   Aug. 25, 2005

Related U.S. Application Data

(62) Division of application No. 10/280,283, filed on Oct. 24, 2002.

(51) Int. Cl.
*H01L 21/4763* (2006.01)

(52) U.S. Cl. ............ 438/624; 438/623; 438/633; 257/759; 257/760

(58) Field of Classification Search ............... 438/8, 438/623, 624, 633, 645, 618, 626; 257/637, 257/638, 759, 760
See application file for complete search history.

(56) References Cited

U.S. PATENT DOCUMENTS

| | | | | |
|---|---|---|---|---|
| 5,559,560 A | | 9/1996 | Lee | 438/586 |
| 6,146,986 A | | 11/2000 | Wagganer | 438/618 |
| 6,252,290 B1 | * | 6/2001 | Quek et al. | 257/522 |
| 6,355,555 B1 | * | 3/2002 | Park | 438/634 |
| 6,413,879 B1 | | 7/2002 | Maeda | 438/758 |
| 6,753,258 B1 | * | 6/2004 | Gaillard et al. | 438/691 |

* cited by examiner

*Primary Examiner*—George Fourson
*Assistant Examiner*—Julio J. Maldonado
(74) *Attorney, Agent, or Firm*—Daniel P. Morris; Harrington & Smith, LLP (57) ABSTRACT

A structure incorporates very low dielectric constant (k) insulators with copper wiring to achieve high performance interconnects. The wiring is supported by a relatively durable low k dielectric such as SiLk or SiO2 and a very low k and less-robust gap fill dielectric is disposed in the remainder of the structure, so that the structure combines a durable layer for strength with a very low k dielectric for interconnect electrical performance.

9 Claims, 6 Drawing Sheets

VERY LOW EFFECTIVE DIELECTRIC CONSTANT INTERCONNECT STRUCTURES AND METHODS FOR FABRICATING THE SAME

CROSS-REFERENCE TO RELATED APPLICATION

This application is a divisional of prior application No. 10/280,283, filed 24 Oct. 2002.

TECHNICAL FIELD

The field of the invention is "back end of the line (BEOL)" interconnections in high performance integrated circuits and in packaging integrated circuits.

BACKGROUND OF THE INVENTION

High performance microprocessor, microcontroller and communication chips require very high speed interconnects between the active transistor devices which are used to perform the various functions such as logical operations, storing and retrieving data, providing control signals and the like. With the progress in the transistor device technology leading to the present ultra large scale integration, the overall speed of operation of these advanced chips are beginning to be limited by the signal propagation delay in the interconnection wires between the individual devices on the chips. The signal propagation delay in the interconnects is dependent on the RC product where R denotes the resistance of the interconnect wires and C represents the overall capacitance of the interconnect scheme in which the wires are embedded. Use of copper instead of Al as the interconnect wiring material has allowed the reduction of the resistance contribution to the RC product. The current focus in the microelectronics industry is to reduce interconnect capacitance by the use of lower dielectric constant (k) insulators in building the multilayered interconnect structures on chips.

One prior art method of creating interconnect wiring network on such small a scale is the dual damascene (DD) process schematically shown in FIG. 1. In the standard DD process, an inter metal dielectric (IMD), shown in FIG. 1a as two layers 1110, 1120 is coated on the substrate 1100. The via level dielectric 1110 and the line level dielectric 1120 are shown separately for clarity of the process flow description. In general, these two layers can be made of the same or different insulating films and in the former case applied as a single monolithic layer. Historically, both layers are made from an inorganic glass like silicon dioxide ($SiO_2$) or a fluorinated silica glass (FSG) film deposited by plasma enhanced chemical vapor deposition (PECVD). A hard mask layer or a layered stack 1130 is optionally employed to facilitate etch selectivity in the subsequent patterning steps and to serve as a polish stop. The wiring interconnect network consists of two types of features: line features that traverse a certain distance across the chip, and the via features which connect lines in different levels of interconnects in a multilevel stack together.

Figure 1A:
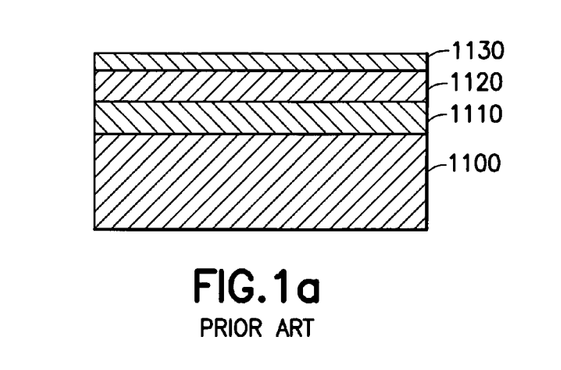
FIG. 1. Dual Damascene process flow for the fabrication of copper interconnects (Prior Art).
Figure 1B:
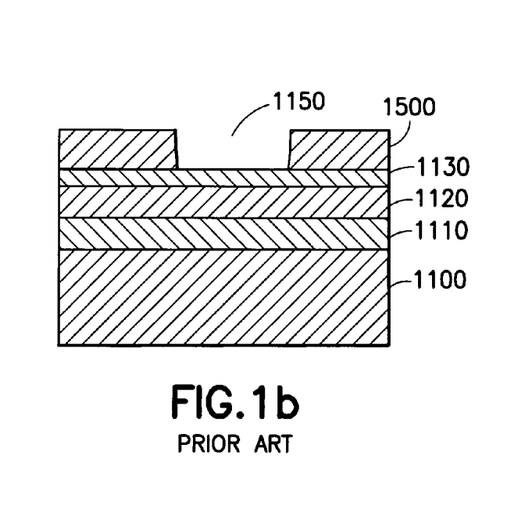
Figure 1C:
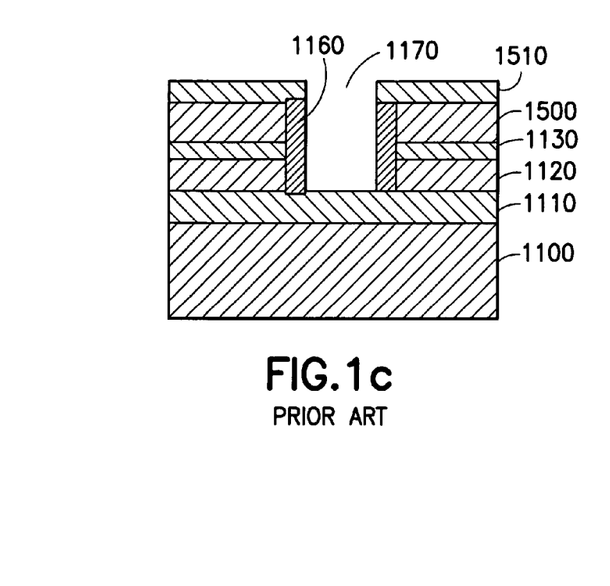
Figure 1D:
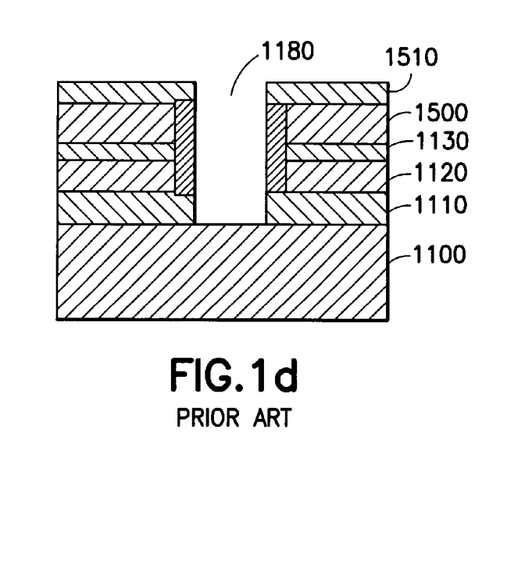
Figure 1E:
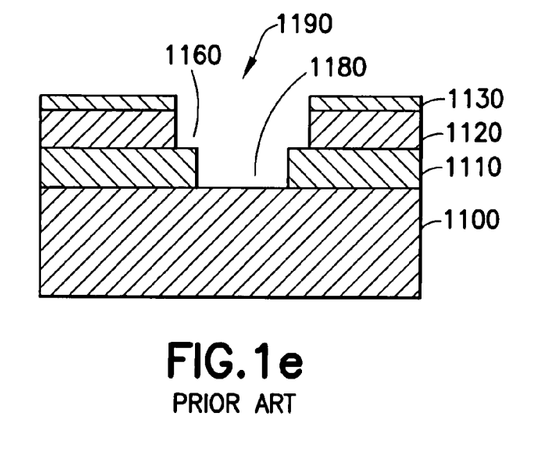
Figure 1F:
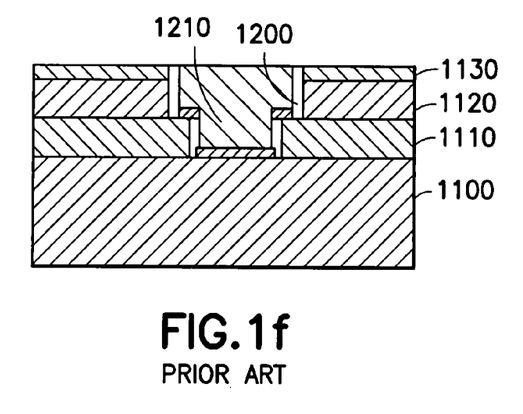
Figure 1G:
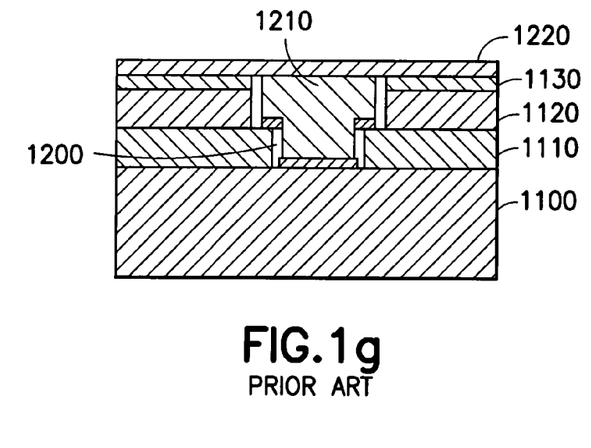

In the dual damascene process, the position of line 1150 and a via 1170 is defined lithographically in an example of a "line-first" approach. Lithography is used to define a trench pattern 1150 in photoresist 1500 (FIG. 1b) and a via pattern 1170 in photoresist layer 1510 (FIG. 1c) and the pattern is transferred into the dielectric material to generate a via opening 1180, FIG. 1d. The dual damascene trench and via structure 1190 is shown in FIG. 1e after the trench has been etched and the photoresist has been stripped. This recessed structure 1190 is then coated with a conducting liner material or material stack 1200 that serves to protect the conductor metal lines and vias and functions as an adhesion layer between the conductor and the IMD. This recess is then filled with a conducting fill material 1210 over the surface of the patterned substrate. The fill is most commonly accomplished by electroplating of copper although other methods such as chemical vapor deposition (CVD) and other materials such as Al or Au can also be used. The fill and liner materials are then chemical-mechanical polished (CMP) to be coplanar with the surface of the hard mask and the structure at this stage is shown in FIG. 1f. A capping material 1220 is deposited as a blanket film, as is depicted in FIG. 1g to passivate the exposed metal surface and to serve as a diffusion barrier between the metal and any additional IMD layers to be deposited over them. Silicon nitride, silicon carbide, and silicon carbonitride films deposited by PECVD are typically used as the capping material 1220. This process sequence is repeated for each level of the interconnects on the device. Since two interconnect features are simultaneously defined to form a conductor inlaid within an insulator by a single polish step, this process is designated a dual damascene process.

In order to lower the capacitance, it is necessary to use lower k dielectrics such as organic polymers, low k PECVD films containing Si, C, O and H and spin on organo-silicate glasses which have k values in the 2.5 to 3.0 range instead of the PECVD silicon dioxide based dielectrics (k=3.6 to 4.0). The k value can be further reduced to 2.2 (ultra low k) and even below 2.0 (extreme low k) by introduction of porosity in these insulators. For the purpose of brevity, we shall refer to these ultra low k and extreme low k materials collectively as very low k materials in this document. Although a tunable range of k values is possible with this set of very low k materials there are several difficulties in integrating these materials with copper interconnects by the dual damascene process described above.

First, these low k dielectrics have a much lower elastic modulus, fracture toughness and cohesive strength than the silicon dioxide or FSG films and their adhesion to typical hard mask layers used in current state of the art copper interconnect is also correspondingly inferior. As a result, when the CMP of the copper fill is attempted during the dual damascene interconnect build, delamination occurs either cohesively in the weak low k material or adhesively at the interface between the very low k material and the hard mask. This renders the DD process highly impractical from the point of view of manufacturability and yields.

Second, most of the very low k films, in particular the ones that are organosilicate-based, are very sensitive to plasma exposures because of the relative ease of oxidation or cleavage of the Si-organic group linkage (for example, Si-methyl) which results in sites that react with moisture in the ambient to form silanol (Si—OH) groups in the film. Silanols absorb $H_2O$ and hence increase the dielectric constant and the dielectric loss factor of the film significantly thus negating the performance benefits expected from the very low k films. Since reactive ion etch and plasma etch are key steps required in the formation of the dual damascene trench and via structure as described above and in the removal of photoresists used in patterning the very low k materials, it is very difficult if not impossible to avoid plasma damage of this class of films during a prior art dual damascene integration.

Third, many of the organosilicates tend to react with the highly sensitive photoresist layers used to define the fine interconnect pattern leading to a deterioration of the imaging and resolution capability of the resists. This phenomenon referred to as photoresist poisoning is further aggravated when lithography is attempted on a previously reactive ion etched surface of these dielectrics-(as for example, during the lithography step to define via patterns in a photoresist coated over a previously reactive ion etched trench pattern in the low k dielectric film or vice versa).

Additionally, the material make up of the dual damascene interconnect structure significantly degrades the effective dielectric constant (keff). This is due to the presence of higher k hard mask layers and cap layers in the structure. Although, the effective k can be lowered using the very low k intermetal dielectrics (if they can be successfully integrated), the keff reduction achievable is limited by the presence of higher k dielectric layers typically used for the hard mask and the cap layer described in FIG. 1. Thus for example, when the k of the IMD is reduced from 2.65 to 2.2 (a 17% reduction in k), the keff is only reduced from 3.04 to 2.68 (only a 12% reduction) because of the effects of the contribution from these higher k layers. Another aspect of the prior art DD integration of very low k dielectrics is the use of optional reactive ion etch stop layers (not shown in FIG. 1) disposed between the dielectric layers 1110 and 1120. The function of this layer is to act as RIE stop between the two layers and hence allow better control of the etch depths and bottom surface topography of the line trenches. These etch stop layers also have a higher dielectric constant than the very low k dielectrics and hence further degrade the keff of the DD structures containing them. Further, the thickness of these hard mask, cap and etch stop layers do not scale proportionally with decreasing interconnect layer and IMD thickness expected in future generations. This is because the reliable functioning of these layers requires a minimum thickness that is independent of the IMD thickness. The result is that the detrimental effect of these high k layers is further aggravated at finer ground rules required for the future microelectronic interconnect structures.

One prior art approach that addresses some of the issues raised above is U.S. Pat. No. 6,146,986 by Wagganer. This patent teaches the use of photoresist as a temporary interlayer dielectric for the via openings and the line trenches, filling these with the metal and planarizing as in the standard dual damascene process as described above, stripping the photoresist all around the metal and filling all the spaces opened up between and underneath the metal features with the very low k dielectric films. Although this approach avoids the exposure of the very low k dielectric to the plasma processes, it will be exposed to some photoresist processing. Additionally, this process is not reliably manufacturable due to the fact that the lines are suspended using only the vias as support after the photoresist is stripped which will be extremely fragile to handle and are quite likely to deform when the supporting resist is being removed. Further, the fill process of the very low k dielectric has to fill under the lines in order to provide support and this is likely to be difficult to achieve. Even if this does occur the best final structure will only have the mechanically weak very low k dielectric everywhere around and under the lines and this will present delamination problems similar to the standard dual damascene polishing process, when the next level of interconnect is fabricated on top of the filled and planarized structure.

It is clear therefore that an alternate integration method is required to avoid the above stated problems associated with the prior art structures and achieve a mechanically robust and lower keff interconnect structure using very low k IMD materials.

There is a need to avoid damaging and increasing the dielectric constant of the very low k dielectric during the various processing steps employed.

There is a further need to avoid the delamination of the structures during metal chemical-mechanical polishing steps. There is a further need to eliminate the possibility of photoresist poisoning problems stemming from its interactions with the very low k dielectric materials. Satisfaction of these needs is achieved by the inventive method described in detail below.

SUMMARY OF THE INVENTION

The invention relates to an interconnect structure without subsidiary structures that detract from very low effective dielectric constant (keff) intermetal dielectric films.

A feature of the invention is a method of integration to produce a very low keff structure by minimizing or eliminating the contributions of the hard mask, etch stop and cap layers in the interconnect structure.

Another feature of the invention is the fabrication of a layer of interconnect using a hard mask with a relatively high dielectric constant and then removing the hard mask.

Yet another feature of the invention is a provision of a support dielectric under the interconnect lines to enhance the mechanical strength of the interconnect structure.

BRIEF DESCRIPTION OF THE DRAWING

FIG. 4 shows prior art (4a) and full etch back gap fill (4b) structures according to the invention (4b) used in the k effective calculations.

DETAILED DESCRIPTION OF THE INVENTION

This invention pertains to the very high performance microelectronic chips used in computers, microprocessors, microcontrollers, sensors, communication devices and the like. In particular, the inventive structures described herein pertain to the interconnect wiring networks on such chips, significantly reducing the signal propagation delay associated with these wires. The inventive methods detailed and claimed provide the integration steps required to fabricate these high performance interconnect networks with copper wiring and very low dielectric constant dielectrics.

Figure 2A:
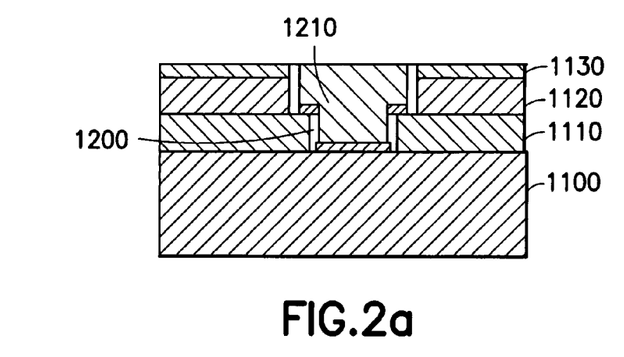
FIG. 2. Inventive method using full etch back and gap fill process flow and the resulting interconnect structure with a very low effective dielectric constant.

The inventive method taught is described as the "Etch back and Gap Fill" (EBGF) integration scheme. This method begins with the fabrication of a dual damascene (DD) interconnect structure comprising the prior art steps described earlier and depicted in FIG. 1. The DD structure is built using intermetal dielectric materials (IMD) which are preferably more robust compared to the very low k dielectrics that will be later on incorporated as described below. It is also preferred that the two IMD layers 1110 and 1120 are identical. The EBGF process begins with a DD structure before the cap 1220 is applied. As shown in FIG. 2a, the starting structure is therefore the same as the structure shown in FIG. 1f. First, the substrate with the DD layers is loaded into a reactive ion etch chamber and the hard mask stack 1130 and the IMD layers 1110 and 1120 are directionally etched using appropriate feed gases and plasma conditions. The etch process is chosen such that the hard mask and IMD are etched at preferentially higher rates while the copper line and the conductive liner are not etched.

Figure 2B:
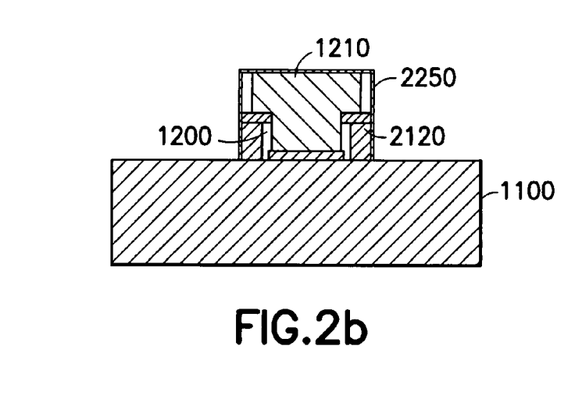

The result is the structure shown in FIG. 2b wherein all of the hard mask stack 1130 and the regions of the IMD layers 1110 and 1120 not directly located beneath the lines are etched out leaving only the beam like line support region 2120 of the IMD (referred to as the support dielectric) under the interconnect lines and encasing the interconnect vias. Since the interconnect lines 1210 have a bottom surface that is separated from the top of the supporting surface by a vertical distance equal to the height of the interconnect vias, the support regions 2120 extend under most of the line with a thickness equal to the vertical distance, providing solid support. In this cross section, two regions 2120 bracket the via. In front of and behind the via, the line support region will extend the full width of line 1210. This step is termed the etch back step of the inventive process and results in the interconnect wiring and vias being supported on beams of a robust support dielectric material. The wiring metal used in the original DD interconnect is preferably copper although other materials such as Al or Au may also be used. The support intermetal dielectric used is preferably an organic polymer with thermal stability at the temperatures required for the formation of the very low k dielectric films (typically 400° C. to 450° C.) and that affords easy fabrication to form the DD interconnects referred to above. The additional requirement is that the IMD chosen is readily etchable by a directional plasma etch process without damaging the copper lines or the conductive liner material. Examples of such organic polymers include SiLk™ which is a spin on aromatic thermoset polymer produced by the Dow Chemical Company, Flare™ a spin on organic polymer made by Honeywell Microelectronic Materials and amorphous hydrogenated diamond like carbon (DLC) deposited by PECVD. Other materials such as spin on glasses, silicon oxide, fluorinated silicon oxide may also be used as this robust support layer dielectric. A porous dielectric may also be used as the support dielectric, so long as it is mechanically more robust than the very low k dielectric to be discussed below.

In the case of SiLk, the etch back step would preferably employ a reducing chemistry such as forming gas, nitrogen, N—H plasmas, or a pure hydrogen plasma. Optional additions of oxygen, $CO_2$ and fluorocarbons can also be used in the plasma feed gas to optimize etch selectivity and etch profiles.

Next, an optional wet clean and bake out of the etched back structure may be performed to remove any residues between the lines and/or to clean residues or nonvolatilereaction products that may have formed on top of the lines. Any organic solvents used for cleaning SiLk or equivalent low-k materials may be used, leaving a clean surface suitable for good adhesion of the next layer.

After the surface has been prepared, an optional conformal encapsulating layer may be deposited that covers the top of the interconnect material, the sides of the liner material and the sides of the supporting material 2120, as well as the top surface of the layer beneath, which may be the top of the ILD or a cap layer. The material of the encapsulating layer is required to have: a) good adhesion to Cu, to the ILD and to the support liner material; b) conformal deposition and coverage of Cu; and c) good adhesion to the final gap fill dielectric to be deposited subsequently.

Suitable materials are amorphous films of SiCH, SiNCH, nitride (Si3N4), SiCOH and oxide (SiO2). The thickness of the conformal layer will be sufficient to confine the copper and block oxygen, illustratively about 5–20 nm. Preferably, the conformal material is an insulator, in order to reduce the danger of short circuits to other features. During the step of opening a contact (at the bottom of a via) from the layer above to the layer illustrated, the etching step to open the via will remove the insulating conformal layer only at the area that makes electrical contact. Those skilled in the art will be able to add other materials to the list in the light of this disclosure.

The deposition process for the conformal layer may be illustratively atomic layer deposition, chemical vapor deposition (CVD) or a plasma enhanced CVD process adjusted for good conformality.

Because the copper is sealed into the interconnect structure, reliability is improved and damage to the liner by the CMP or etching process is reduced. Advantageously, the conformal encapsulating liner materials are more durable with respect to CMP and etching than the final gap fill material. Further, the liner is protected from oxidation and/or corrosion.

Figure 2C:
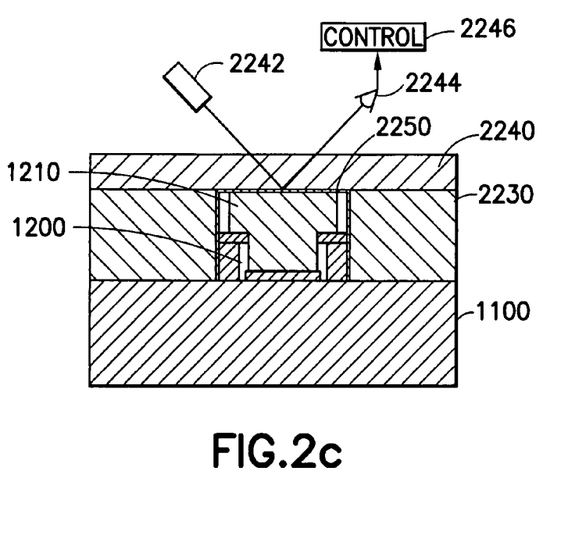

In the next step, the etched gaps created in the etch back step are filled with the desired very low k dielectric. The preferred gap fill process is one that uses a spin on dielectric precursor solution that has the appropriate Theological properties such as viscosity and surface tension to completely penetrate, wet and fill the gaps and to overcoat the line tops resulting in a nominally planarized structure with a small amount of overburden when the precursor is fully cured to form the very low k dielectric film. The ability of the films to gap fill and planarize without significant stress build up during their curing is desirable in order to maintain the integrity of the filled structures. Additionally, it is preferred that the k of the gap fill dielectric (GFD) is significantly lower than that of the support 2120 in order that the inter-line capacitance between adjacent lines is reduced. Examples of such gap fill dielectrics include spin on glasses based on methyl silsesquioxane, hydrido silsesquioxane, tetraethyl orthosilicate and mixtures thereof; benzocyclobutene based polymers; aromatic thermoset polymers; and porous spin on dielectric films derived from these spin on materials by incorporating controlled levels of porosity to lower the dielectric constant. Some specific commercial examples of possible GFD films include Nanoglass™ manufactured by Honeywell Microelectronic Materials Inc., Dendriglass™ which is a material developed by IBM Corporation, and XLK™ dielectric developed by Dow Corning Inc. Other very low k materials and other deposition methods can also be used as long as the proviso regarding gap fill and planarization described above are met. The structure at this stage after gap fill is depicted in FIG. 2c, wherein the gap fill dielectric between the lines is denoted by 2230 and the overburden region is denoted 2240.

Figure 2D:
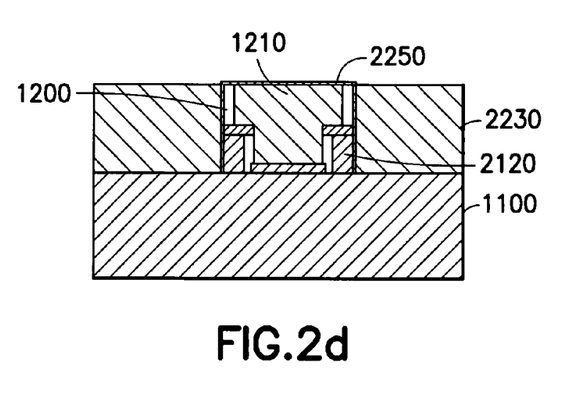

Next, the excess GFD overburden 2240 covering the line tops is removed by a CMP, a single or two step RIE or a combination thereof such that the end result is a structure shown in FIG. 2d wherein the top surface of the GFD is coplanar with the top surface of the interconnect lines and only the region 2230 of the GFD now remains in the structure. It has been discovered that many of the very low k dielectric films which cannot readily withstand the CMP of copper disposed over an IMD/hard mask stack can be directly polished and planarized by the CMP process described above.

CMP, though well developed, is subject to the problem of dishing the GFD around the metal line in some sparsely metal filled areas. Metal on the next level tends to be located in the dished areas, with consequent problems of shorting.

An alternative is the use of a combination of CMP and RIE. After the filling step, the overfilled dielectric is globally planarized with a brief touch up CMP, leaving the structure shown in FIG. 2c. A RIE step removes the excess GFD, leaving the structure shown in FIG. 2d. Advantageously, the CMP is performed directly on the GFD, which is relatively easily polished compared with the interconnect and its conformal coating. Even though the GFD is known to be fragile, it has been found that it is unexpectedly suitable for CMP. In view of the fragility of GFD materials, CMP slurry is preferably very mild chemically, with material removal being primarily effected by gentle mechanical action.

Alternatively, a predictive etching process is used, in which radiation source 2242 emits a beam of radiation that reflects off the top surface of the metal interconnect preferentially to the dielectric. Detector 2244 monitors the reflected radiation and sends an etch change signal to control 2246 when the remaining thickness of the GFD is less than a reference amount. Control 2246, which may be a general purpose computer then controls the etching system to switch from a first aggressive etch (meaning more rapid material removal) to a second, less aggressive etch that does not significantly attack or dish the GFD 2230. A number of conventional detection techniques may be employed, a simple one being optical emission to detect reaction products emitted when the etching gases react with the metal. That technique would avoid the need for an optical source, but carries the risk of damage to the interconnect. Preferably, a predictive endpoint system is used, in which the thickness of the overlying dielectric is monitored and one or more parameters of the etching process (e.g. reducing the reactant gas flow, changing the reactant gas chemistry, reducing the bias voltage, or other techniques known to the art) is changed to slow down the etching rate before the top surface of the metal is exposed from a first (more aggressive) etching process to a second process that is less aggressive and therefore does not attack the interconnect structure or dish the GFD. By changing the chemistry or other parameters, to a less aggressive process, one can avoid damage to the interconnect material and/or the liner materials, as well as avoiding the dishing problem. Techniques such as spectral ellipsometry, interferometry (laser, optical emission, or filter broad band strobe) may be used in the endpoint process, with interferometry being preferred due to the ease of the optical access requirements compared with ellipsometry. The choice of the overburden removal process depends on tradeoffs of speed versus cost, damage, etc.

Figure 2E:
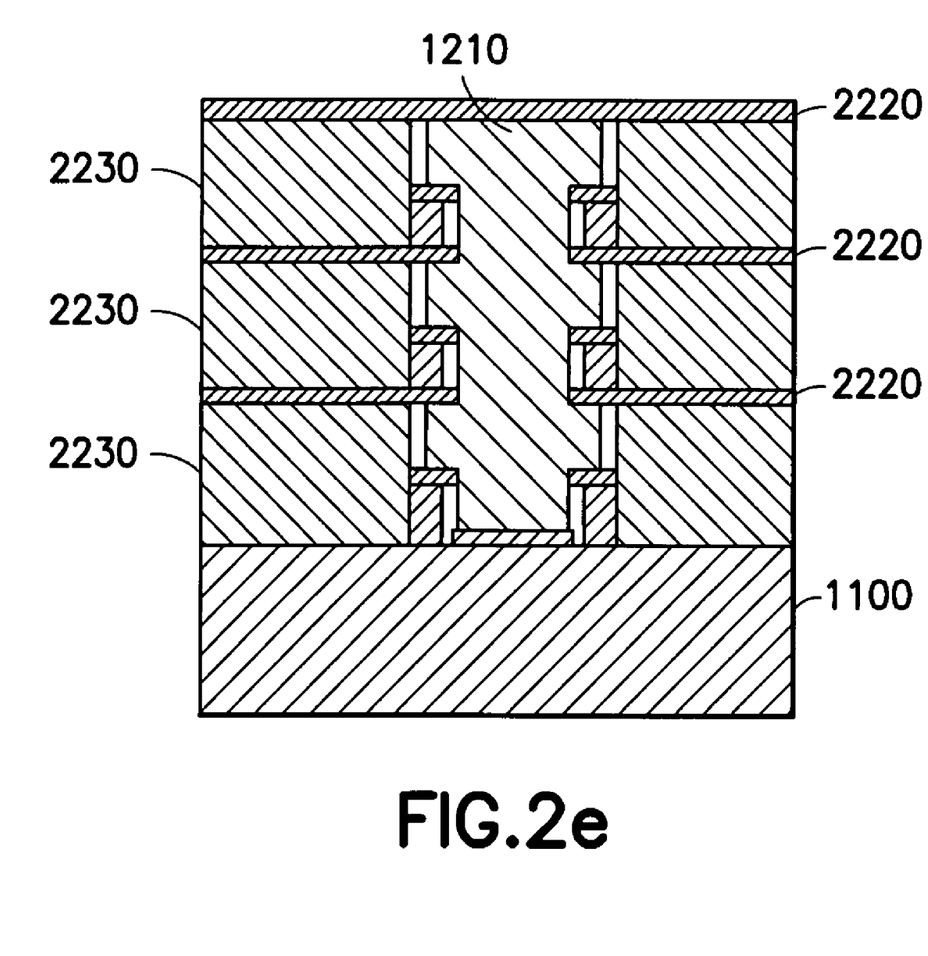

The resulting EBGF structure of FIG. 2d is then capped with a cap layer 2220 which is similar to the layer 1220 employed in the prior art method and functions as a copper diffusion barrier. The cap layer can supplement the diffusion barrier function to block Cu and oxygen derived from the optional encapsulating barrier described above. In EBGF structures where the optional encapsulating barrier is not used, the cap provides these functions entirely. Different cap options are possible as will be described later in connection with additional reduction in the effective dielectric constant. The process of dual damascene build, etch back and gap fill described above is then repeated as needed to form a multilevel interconnect structure depicted in FIG. 2e. It should be noted that the inventive method described herein has circumvented all the process steps or exposures of the very low k dielectrics that were problem prone in the prior art DD process, namely: RIE patterning of the very low k dielectric, contact between the very low k dielectric and the photoresist and possible resist poisoning, and CMP delamination from a metal on dielectric stack. Additionally, the EBGF interconnect structure has a lower effective dielectric constant compared to the state of the art DD structures because: (1) integration of very low k dielectrics not possible by the prior art is enabled; (2) the k of the very low k films is maintained since they are not damaged by plasma or other harsh process exposures; and (3) the hard mask and optional etch stop layers which are traditionally higher in k than the IMD are eliminated from the final structure. The method leads to robust interconnect structures with very low k dielectrics in them compared to the prior art DD method by virtue of the robust line support material that is employed. Although line support 2120 could have a higher k value than the GFD, its impact on the overall interconnect capacitance is not that high because it is only present below and not between the lines and is more than offset by the three aspects described above.

Additional reduction in the effective dielectric constant of the interconnect structure can be realized by restricting the cap to be present only over the lines and eliminating it from between the lines, as shown in FIG. 2f. Methods described in copending IBM patent application Docket YOR920020155US1, incorporated by reference, among other methods, can be utilized to produce this selective cap structure. Another option (not shown) comprises the combination of a selective cap on the interconnect lines and a second low k continuous cap over the entire planarized surface of the lines and the GFD to further enhance the barrier functions. These options are particularly important if the optional conformal barrier layer is not used.

Figure 3A:
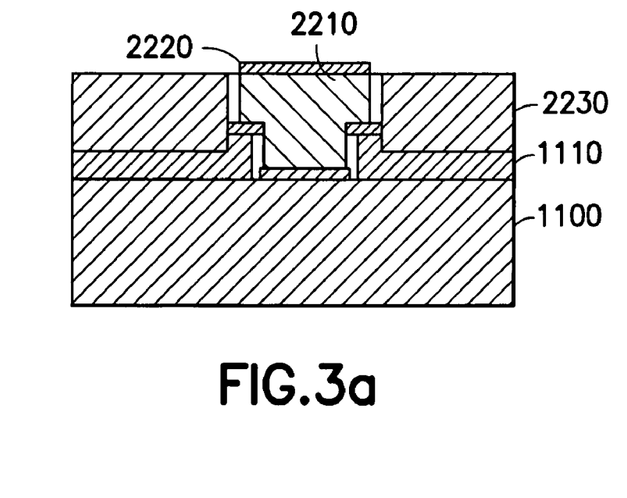
FIG. 3. Inventive method using partial etch back and gap fill process flow and the resulting interconnect structure with a very low effective dielectric constant.
Figure 3B:
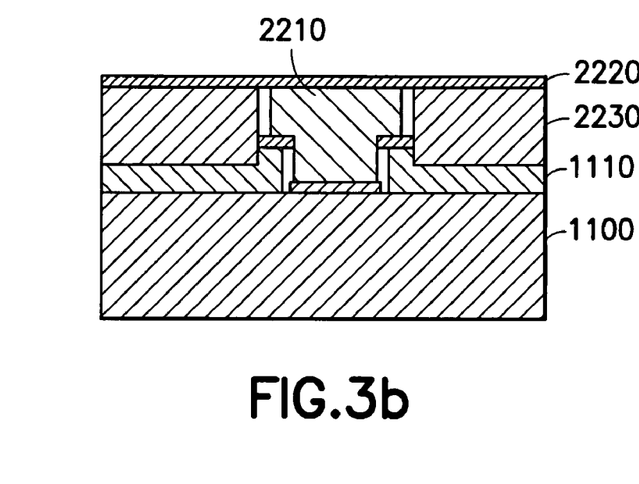

In another alternate embodiment, it is possible to provide a more robust support to the very low k dielectric gap fill material by etching back the robust support dielectric only part way through the structure so that it is recessed either just up to or below the bottom of the line trenches and proceeding with the gap fill and planarization as described above. The resulting final structures with selective cap and continuous caps are shown in FIGS. 3a and 3b respectively. The lower IMD 1110 extends all the way across the figure, providing mechanical strength in the horizontal direction. These structures will be mechanically more robust than the ones shown in FIG. 2e or 2f but will be slightly higher in effective dielectric constant and hence slightly inferior in interconnect performance.

There is a requirement on the choice of gap fill materials used in this inventive method and structure, in that they should be able to reliably penetrate and fill the narrow gaps generated by the etch back process. Additionally it is preferred that the gap fill material exhibits a high degree of planarization after fill and any optional cure steps. Those skilled in the art will readily be able to adjust their film deposition and cure process schedules and CMP process conditions to achieve optimum gap fill and planarization without damage to the rather fragile interconnect lines. With the appropriate choice of these various factors it is possible build multilevel interconnect structures by the etch back and gap fill method having acceptable electrical yields.

Since the parameters will vary, depending on the choice of material, practitioners will adjust the process recommended by the manufacturer in the light of this disclosure, without deviating from the spirit and scope of this disclosure.

Figure 4A:
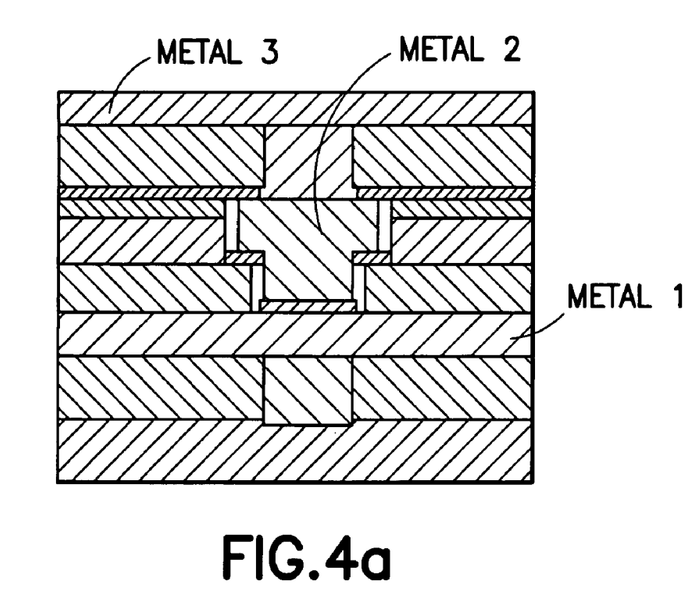
Figure 4B:
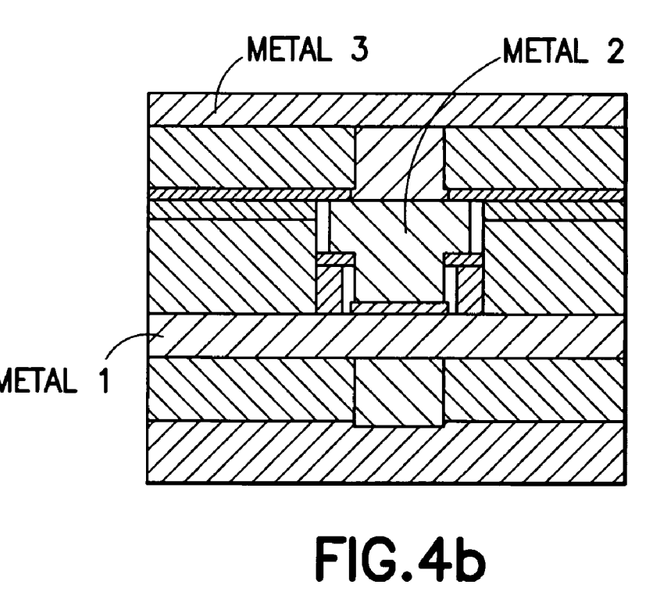

The effective dielectric constant of the prior art standard dual damascene wire structure shown in FIG. 4a and the etch back and gap fill structure of the current inventive method shown in FIG. 4b has been modeled. The calculation models the wire in Metal 2 level shown in the presence of a wiring level above (Metal 3) and a wiring level below (Metal 1) constructed in the same fashion in each case. Wires in a given level are assumed to run orthogonal to the wires in the levels above and below. Capacitance in the lateral and vertical directions are computed and added. Typically the lateral capacitance is added twice to represent the contributions from neighboring wires in the same level. The total capacitance in each case is then normalized to the capacitance value calculated for the same structure with all the dielectrics replaced with air assumed to have a k value of 1. The robust support dielectric with a k of 2.65 was used along with a cap layer with a k of 4.5 in both structures. The gap fill material used in the inventive structure had a k of 2.1. Other prior art structure parameters used in the calculation are as follows: Hard mask 35 nm thick, k=4.5; Cap layer 50 nm thick, k=4.8; Line level and via level thickness 300 nm each; line width and spacing 130 nm. The calculations yield a value of effective k of 2.85 for the prior art structure and 2.5 for the current inventive structure. This represents a significant improvement in performance and further improvements are possible by using gap fill dielectrics with lower k and by using selective cap layers.

Although the invention has been described with respect to a limited number of embodiments, those skilled in the art will appreciate that other embodiments may be constructed within the spirit and scope of the following claims.

We claim:

1. An etch back and gap fill method for fabricating an interconnect structure in an integrated circuit comprising the steps of:
    a) Depositing a support dielectric on a supporting surface;
    b) Forming a set of interconnect apertures in said support dielectric, at least some of which apertures have a lower surface separated by a vertical distance from said supporting surface;
    c) Forming a set of wiring features by filling said set of interconnect apertures with an electrically conductive interconnect material and planarizing such that the top surface of said wiring features are substantially coplanar with the top surface of said support dielectric, whereby at least some of said wiring features are supported by a supporting portion of said support dielectric below said lower surface;
    d) Etching said support dielectric with a directional etch using said wiring features as a mask, such that the support dielectric is only left in the structure in said supporting portions underneath said wiring features;
    e) depositing a gap fill dielectric material over said set of wiring features such that the gaps between said set of wiring features are filled with said gap fill dielectric; and
    f) Planarizing said gap fill dielectric until the top surface of said set of wiring features is substantially coplanar with the top surface of said gap fill dielectric.

2. A method according to claim 1, in which said step of planarizing said gap fill dielectric is carried out by chemical-mechanical polishing.

3. An etch back and gap fill method for fabricating an interconnect structure in an integrated circuit comprising the steps of:
    a) Depositing a support dielectric on a supporting surface;
    b) Forming a set of interconnect apertures in said support dielectric, at least some of which apertures have a lower surface separated by a vertical distance from said supporting surface;
    c) Forming a set of wiring features by filling said set of interconnect apertures with an electrically conductive interconnect material and planarizing such that the top surface of said wiring features are substantially coplanar with the top surface of said support dielectric, whereby at least some of said wiring features are supported by a supporting portion of said support dielectric below said lower surface;
    e) Etching said support dielectric with a directional etch using said wiring features as a mask, such that the support dielectric is only left in the structure in said supporting portions underneath said wiring features;
    e) depositing a gap fill dielectric material over said set of wiring features such that the gaps between said set of wiring features are filled with said gap fill dielectric; and
    f) Planarizing said gap fill dielectric until the top surface of said set of wiring features is substantially coplanar with the top surface of said gap fill dielectric, in which said step of planarizing said gap fill dielectric further comprises an etching process comprising a first etching process and a second etching process less aggressive than said first etching process;
    monitoring said first etching process with an end point detection system and changing to said second etching process before said set of wiring features is exposed; and
    continuing said second etching process until the top surface of said set of wiring features is substantially coplanar with the top surface of said gap fill dielectric.

4. A method according to claim 2, further comprising a step of depositing a conformal encapsulating layer over said set of wiring features before said step of depositing a gap fill dielectric.

5. A method according to claim 4, in which the material of said encapsulating layer blocks oxygen and copper, whereby copper interconnect material is confined within said wiring features and oxygen is excluded from said wiring features.

6. A method according to claim 5, in which the material of said encapsulating layer is selected from the group comprising SiCH, SiNCH, Si3N4, SiCOH, and SiO2.

7. A method according to claim 3, in which said monitoring is performed by an interferometry system that emits an etch change signal when the thickness of said gap fill dielectric over said wiring features is less than a reference amount, whereby said first etching process is stopped and said second etching process is started in response to said etch change signal.

8. The method according to claim 2, wherein said gap fill dielectric is selected from the group comprising both solid and porous; spin on glasses including at least methyl silsesquioxane, hydrido silsesquioxane, and mixed silsesquioxanes; amorphous hydrogenated dielectric films including silicon and at least one of carbon, hydrogen, oxygen and nitrogen; spin on organic dielectrics including at least polyimides, benzocyclobutene, polybenzoxadoles and aromatic thermoset polymers based on polyphenylene ethers; chemical vapor deposited polymers including at least poly par-axylylene; and combinations thereof.

9. A method according to claim 3, further comprising a CMP step performed before said step of planarizing said gap fill dielectric by etching.

* * * * *